United States Patent [19]

Hashimoto

[11] Patent Number: 5,719,575
[45] Date of Patent: Feb. 17, 1998

[54] D/A CONVERSION INTERFACE FOR DIGITAL SERVO SIGNALS

[75] Inventor: Shinichi Hashimoto, Kyoto, Japan

[73] Assignee: Rohm Co., Ltd., Kyoto, Japan

[21] Appl. No.: 699,386

[22] Filed: Aug. 19, 1996

[30] Foreign Application Priority Data

Aug. 24, 1995 [JP] Japan ................... 7-215604

[51] Int. Cl.$^6$ ................... H03M 1/66
[52] U.S. Cl. ................... 341/144
[58] Field of Search ................... 341/144, 112, 341/114, 115, 117; 318/685; 360/77.08, 78.13

[56] References Cited

U.S. PATENT DOCUMENTS 4,954,906  9/1990  Nakamura et al. ........... 360/77.08

Primary Examiner—Brian K. Young
Attorney, Agent, or Firm—Nikaido, Marmelstein, Murray & Oram LLP

[57] ABSTRACT

A D/A conversion interface is provided with a first switch for supplying a constant current to a smoothing circuit that outputs an analog signal, and a second switch for extracting the constant current from the smoothing circuit. The operation period of the first switch is controlled by forward signal pulses of a digital servo signal; the operation period of the second switch is controlled by reverse signal pulses of the digital servo signal.

6 Claims, 6 Drawing Sheets

<FORWARD>     <REVERSE>

(a) ⎍⎍     ————

(b) ————     ⎍⎍

1

D/A CONVERSION INTERFACE FOR DIGITAL SERVO SIGNALS

BACKGROUND OF THE INVENTION

1. Field of the Invention

The present invention relates to a D/A (Digital to Analog) conversion interface for use in the servo circuitry of electronic appliances such as a compact disc player.

2. Description of the Prior Art

Digital servo ICs (Integrated Circuits) are widely used in electronic appliances such as VCRs (Video Cassette Recorders) and CD (Compact Disc) players. This kind of IC outputs PDM, PWM, and other types of pulses that are supplied to a driving circuit for a load such as a motor, actuator, or other. If a load is driven directly by pulses, however, the pulses may cause noise or other problems. For this reason, it is customary to smooth pulses with a low-pass filter before applying to a load.

FIG. 1 shows a conventional circuit for performing such processing. There, as a stage preceding a driving circuit 74 that drives a motor coil 75 serving as a load, an interface circuit 70 is provided. The interface circuit 70 smooths pulses and reduce them to an analog signal. Reference numeral 71 represents a first input terminal to which a forward signal for the motor is supplied; reference numeral 72 represents a second input terminal to which a reverse signal is supplied.

A resistor R1 is connected between the first input terminal 71 and the inverting terminal (−) of an operation amplifier 73; a resistor R2 is connected between the second input terminal 72 and the non-inverting terminal (+) of the operation amplifier 73. Further, an integrator circuit 76 for smoothing is provided between the non-inverting terminal (+) of the operation amplifier 73 and a reference voltage terminal 77. The integrator circuit 76 consists of a capacitor 76 and a resistor R3.

Connected between the output terminal of the operation amplifier 73 and its inverting terminal (−) is a feedback circuit 78, which consists of a resistor R4 and a capacitor C2. When the first input terminal 71 is supplied with forward signal pulses as shown in (a) of FIG. 2, the second input terminal 72 is supplied with no pulses. Reversely, when the second input terminal 72 is supplied with reverse signal pulses as shown in (b) of FIG. 2, the first input terminal 71 is supplied with no pulses. Therefore, it does not happen that both the first and second input terminals 71 and 72 receive pulses simultaneously.

In this conventional circuit, the input pulses such as PWM pulses are first smoothed by the interface circuit 70 before being supplied to the driving circuit 74, so that no noise is generated. This conventional circuit, however, leads to an increased number of circuit elements, because it requires an operation amplifier 73 for the stage preceding the driving circuit 74, a number of resistors R1 to R4, and capacitors C1 and C2.

In particular, since the operation amplifier 73 and the driving circuit 74 are each formed as an IC, an increased number of externally mounted circuit elements such as resistors and capacitors results in increased mounting costs. Moreover, since the pulse signal supplied to the first and second input terminals 71 and 72 are generated by a servo IC (not shown in the figure), if the voltage of the power source for that servo IC varies, the input terminals 71 and 72 receive pulse signals with varying crest voltages.

Such variation in crest voltage results in variation of the output of the interface circuit 70, and further in variation in the current that flows through the coil L. Therefore, the conventional circuit also has a disadvantage in that it does not provide correct servo control.

SUMMARY OF THE INVENTION

The object of the present invention is to provide a D/A conversion interface circuit that is realized with a small number of circuit elements and that provides signals not affected by the variation in crest value of pulse signals.

To achieve the above object, according to the present invention, a D/A conversion interface is provided with a first switch for supplying a constant current to a smoothing circuit that outputs an analog signal, and a second switch for extracting the constant current from said smoothing circuit; an operation period of one of said first and second switches being controlled with forward signal pulses of a digital servo signal, an operation period of the other switch being controlled with reverse signal pulses of the digital servo signal.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 3:
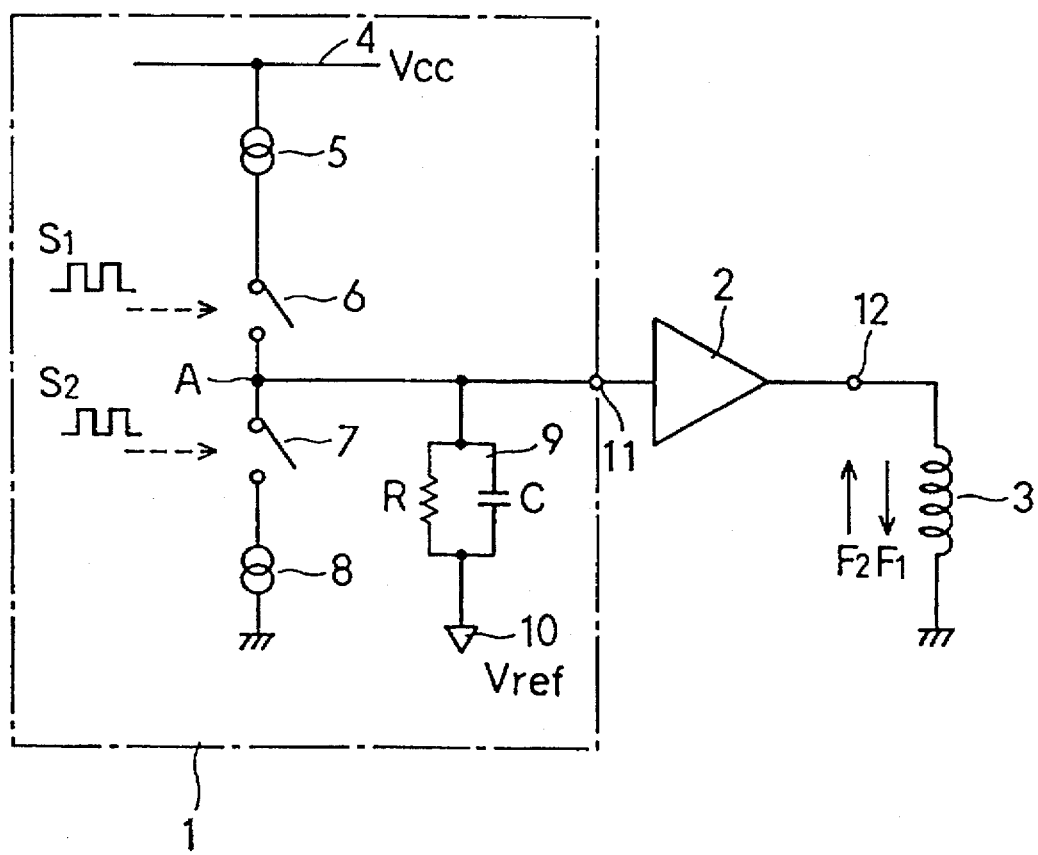
FIG. 3 is a circuit diagram showing an embodiment of the D/A conversion interface of the present invention.

In FIG. 3, reference numeral 1 represents a D/A conversion interface, which is formed as an IC. Between a power source line 4 of a direct-current voltage Vcc and the ground, a constant current source 5, a first switch 6, a second switch 7, and a constant current source 8 are connected in series. To the node A between the first and second switches, one end of the smoothing circuit 9 is connected. The other end of the smoothing circuit 9 is connected to a terminal 10. To the terminal 10, a reference voltage Vref is applied.

The smoothing circuit 9 consists of a resistor R and a capacitor C connected in parallel. The first switch 6 is controlled by forward signal pulses $S_1$ such that it is ON only during pulse periods. The second switch 7 is controlled by reverse signal pulses $S_2$ such that it is ON only during pulse periods. Note that when the forward signal pulses $S_1$ are supplied, the reverse signal pulses $S_2$ are not supplied, whereas when the reverse signal pulses $S_2$ are supplied, the forward signal pulses $S_1$ are not supplied. Here, both the pulses $S_1$ and $S_2$ are PWM (pulse width modulation) signals.

The output terminal 11 of the interface 1 is connected to a load terminal 12 through a buffer 2. Connected to the load terminal 12 is, for example, a motor coil 3. When the pulses $S_1$ are supplied, the first switch 6 is held ON during pulse periods, with the result that a constant current from the constant current source 5 is delivered through the first switch 6 into the smoothing circuit 9.

Since the voltage at the node A is equal to the charge voltage of the capacitor C, the voltage depends on the duration of the period during which the first switch 6 is ON (conducted), that is, it is higher in proportion to the pulse width of the pulses $S_1$. During that period, the second switch 7 is held OFF. Next, when the pulses $S_2$ are supplied, the second switch 7 is held ON during pulse periods, whereas the first switch 6 is held OFF.

As a result, a current flows, from the terminal 10 through the smoothing circuit 9 and the second switch 7, into the constant current source 8, lowering the voltage at the junction A. The voltage at the node A is supplied to the buffer 2, so that a current in proportion to that voltage flows through the motor coil 3. This current flows in the direction as indicated by the arrow F1 when the first switch 6 is ON, and in the direction as indicated by the arrow F2 when the second switch 7 is ON.

As described above, in this embodiment, the durations of ON and OFF periods of the switches 6 and 7 are determined only by the pulse widths of the pulses $S_1$ and $S_2$, and so is the voltage of the output terminal 11. Consequently, the control signal (in this case, driving current) for driving the coil 3 as a load depends only on the pulse widths of the pulses $S_1$ and $S_2$, and accordingly it is not affected by the variation in crest value of the pulses $S_1$ and $S_2$.

Figures 1, 2:
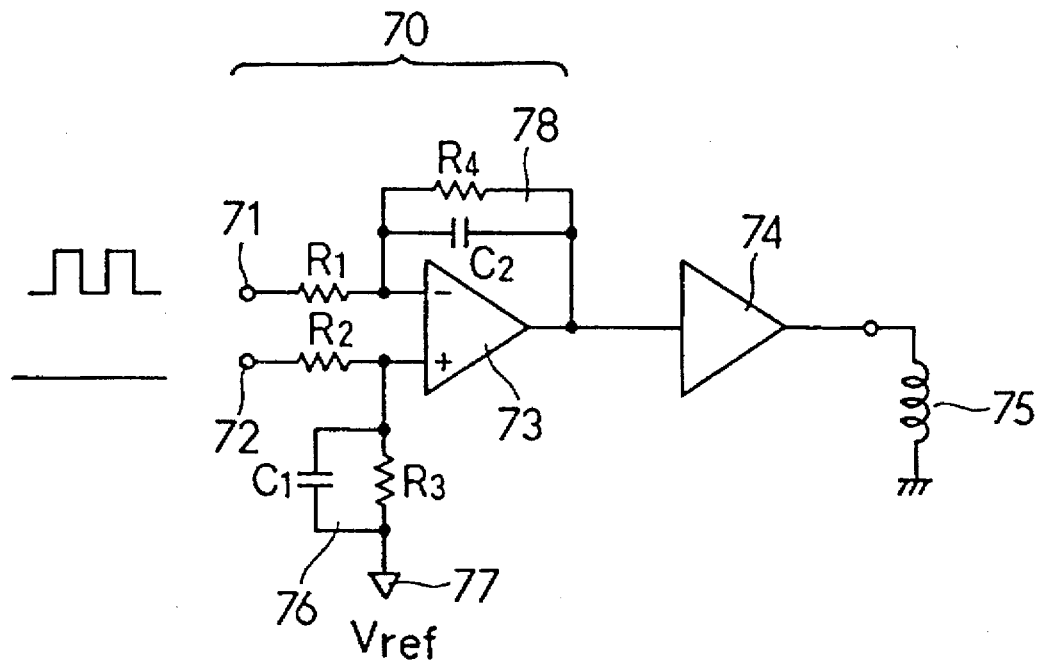
FIG. 1 is a circuit diagram showing a conventional D/A conversion interface and servo circuit.
FIG. 2 is a diagram showing the operation of the conventional D/A conversion interface and servo circuit.
Figure 4:
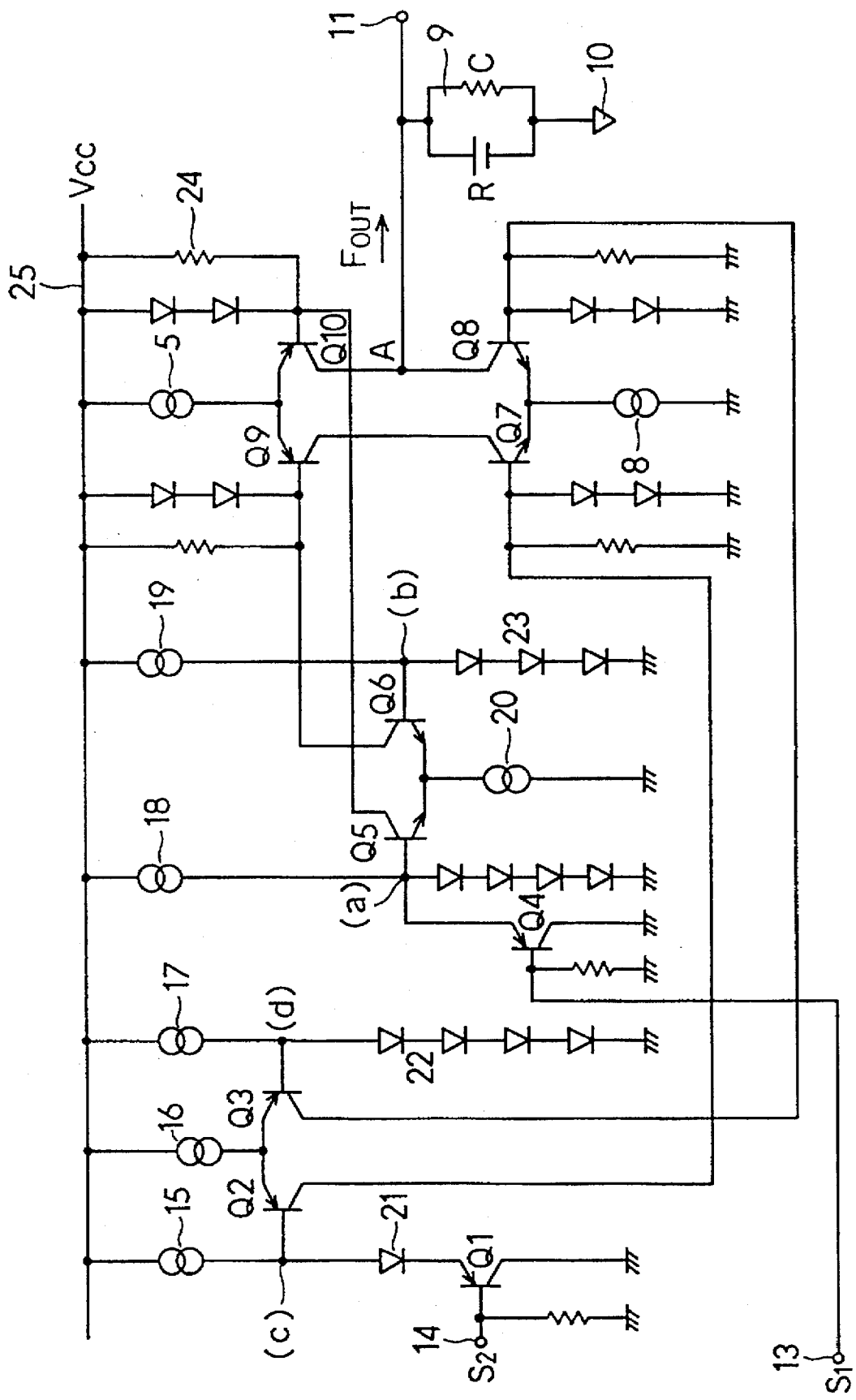
FIG. 4 is a detailed diagram showing the circuit construction of the D/A conversion interface of the present invention.

FIG. 4 shows the details of the above-mentioned interface 1 shown in FIG. 1. In the FIG. 4, reference numeral 13 represents a forward terminal to which the forward signal pulses $S_1$ are supplied, and reference numeral 14 represents a reverse terminal to which the reverse signal pulses $S_2$ are supplied. The forward terminal 13 is connected to the base of a pnp-type transistor Q4. The transistor Q4 has its collector connected to the ground, and its emitter connected to a node a. To this node a, the base of a npn-type transistor Q5 and the output terminal of a constant current source 18 are connected. Further, between the node a and the ground, four diodes are connected.

The transistor Q5 constitutes a differential amplifier in cooperation with a transistor Q6. Reference numeral 20 represents a constant current source for the differential amplifier. The base of the transistor Q6 is connected to a node b between a constant current source 19 and a diode circuit 23. The collector of the transistor Q6 is connected to the base of a transistor Q9, which will be mentioned later.

On the other hand, the reverse terminal 14 is connected to the base of a pnp-type transistor Q1. The transistor Q1 has its collector connected to the ground, and its emitter connected through a diode 21 to a node c. The node c is connected to a constant current source 15, and also to the base of a pnp-type transistor Q2. The transistor Q2 constitutes a differential amplifier in cooperation with a transistor Q3. Reference numeral 16 represents a constant current source for the differential amplifier. The base of the transistor Q3 is connected to a node d between a constant current source 17 and a diode circuit 22.

The collector of the transistor Q2 is connected to the base of an npn-type transistor Q7, and the collector of the transistor Q3 is connected to the base of an npn-type transistor Q8. The emitters of the transistors Q7 and Q8 are connected to a constant current source 8. The collector of the transistor Q7 is connected to the collector of a pnp-type transistor Q9.

The emitter of the transistor Q9 is, together with the emitter of a pnp-type transistor Q10 that constitutes a differential pair with the transistor Q9, connected to a constant current source 5. The base of the transistor Q10 is connected through two diodes to a line 25 of a power source voltage VCC, and through a resistor 24 to the line 25. This base is also connected to the collector of the transistor Q5. The transistor Q10 forms the switch 6 shown in FIG. 1, and the transistor Q8 forms the switch 7.

Next, the operation of the circuit shown in FIG. 4 will be described below. First, when the forward terminal 13 receives forward signal pulses $S_1$, the transistor Q4 turns OFF, and the transistor Q5 turns ON, turning the transistor Q10 ON. On the other hand, the transistor Q6 remains OFF, holding the transistor Q9 OFF. As the result, the current from the constant current source 5 flows through the transistor Q10 into the node A.

Meanwhile, since the reverse terminal 14 receives no pulses, the transistor Q1 turns ON, the transistor Q2 turns ON, and the transistor Q3 turns OFF. The turning OFF of the transistor Q3 results in the transistor Q8 turning OFF. As the result, the current that has flowed from the constant current source 5 through the transistor Q10 into the node A then flows from the node A into the smoothing circuit 9 to be smoothed thereby.

Next, when the reverse terminal 14 receives reverse signal pulses, the transistors Q1 and Q2 turn OFF, turning the transistor Q7 OFF; and the transistor Q3 turns ON, turning the transistor Q8 ON. On the other hand, the turning ON of the transistor Q4, which receives no pulses, causes the transistor Q5 to turn OFF, and the transistor Q6 to turn ON, turning the transistor Q9 ON and the transistor Q10 OFF. As the result, a current flows from the terminal 10, through the smoothing circuit 9, the node A, and the transistor Q8, into the constant current source 8.

Figure 5:
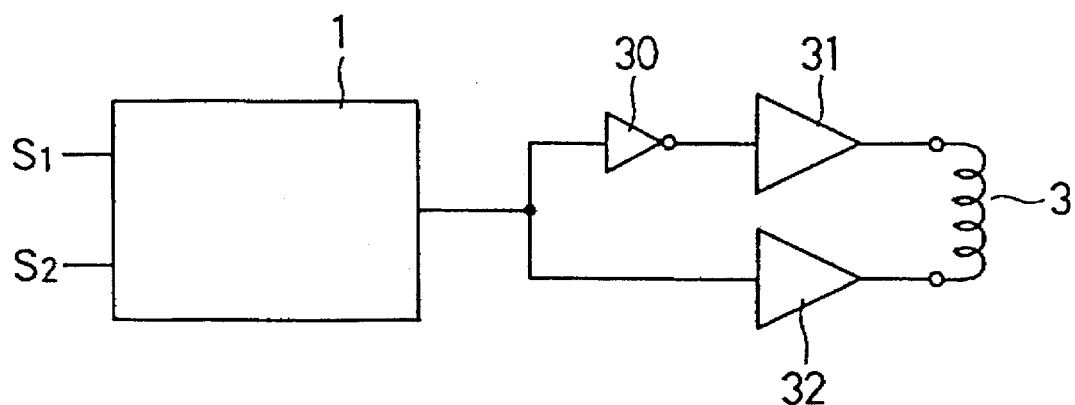
FIG. 5 is a circuit diagram showing another embodiment of the D/A conversion interface of the present invention.

FIG. 5 shows a second embodiment of the present invention. In the above described circuit shown in FIG. 3, one end of the load is connected to the ground, and accordingly the load 3 is driven with respect to a reference voltage $V_{REF}$. By contrast, in the circuit shown in FIG. 5, the load is driven according to the so-called BTL (Balanced Transformer-Less) method, and accordingly the output signal from the interface 1 is fed to two buffers 31 and 32, so that the load is driven by their outputs.

Note that, in order to make the outputs of the buffers 31 and 32 have phases inverse to each other, an inverter 30 is provided as a stage preceding the buffer 31. Thus, the output of the interface 1 is inverted by the inverter 30 before being supplied to the buffer 31.

Figure 6:
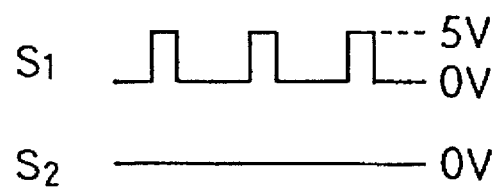
FIG. 6 is a waveform diagram showing the operation of the D/A conversion interface of the present invention.
Figure 7:
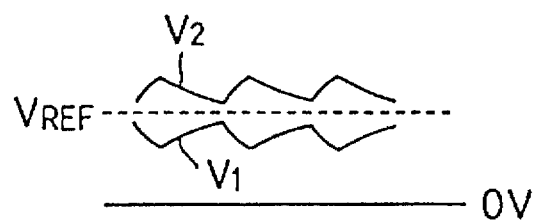
FIG. 7 is another waveform diagram showing the operation of the D/A conversion interface of the present invention.

When the interface 1 is supplied with forward signal pulses $S_1$ but not with reverse signal pulses $S_2$, as shown in FIG. 6, the buffers 31 and 32 produce outputs $V_1$ and $V_2$ that have phases inverse to each other with respect to $V_{REF}$, as shown in FIG. 7. When the interface 1 is supplied with reverse signal pulses $S_2$ but not with forward signal pulses $S_1$, the outputs $V_1$ and $V_2$ have a reversed relationship.

Figure 8:
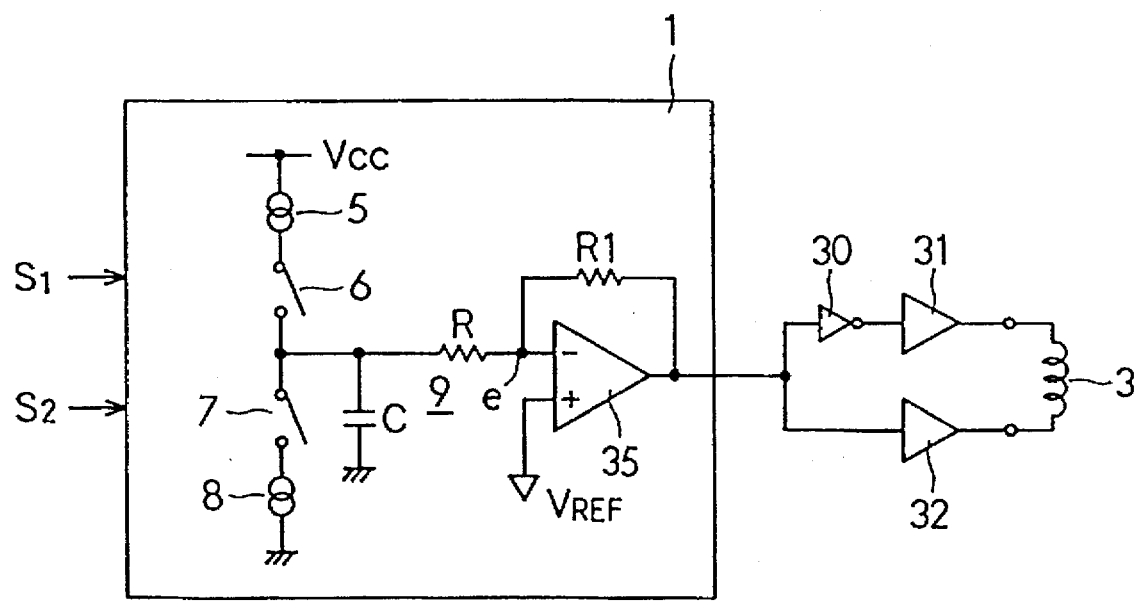
FIG. 8 is a circuit diagram showing still another embodiment of the D/A conversion interface of the present invention.

FIG. 8 shows a third embodiment of the present invention. Here, in order to secure a high gain, the D/A conversion interface circuit is further provided with a current-to-voltage converting amplifier (I/V amplifier) 35, and one end of the resistor R of the smoothing circuit 9 is connected to the inverting input terminal (−) of the I/V amplifier 35. The reference voltage $V_{REF}$ is applied to the non-inverting input terminal (+) of the I/V amplifier 35, and a resistor R1 is connected between the inverting input terminal (−) and the output terminal of the I/V amplifier 35.

In this embodiment, the node e has the same potential as $V_{REF}$. The current that flows into the junction e is converted into a voltage by the I/V amplifier 35, which simultaneously amplifies the voltage for output. The output of the I/V amplifier 35 is connected to a load-driving circuit, which has the same construction as the embodiment shown in FIG. 5.

Figure 9:
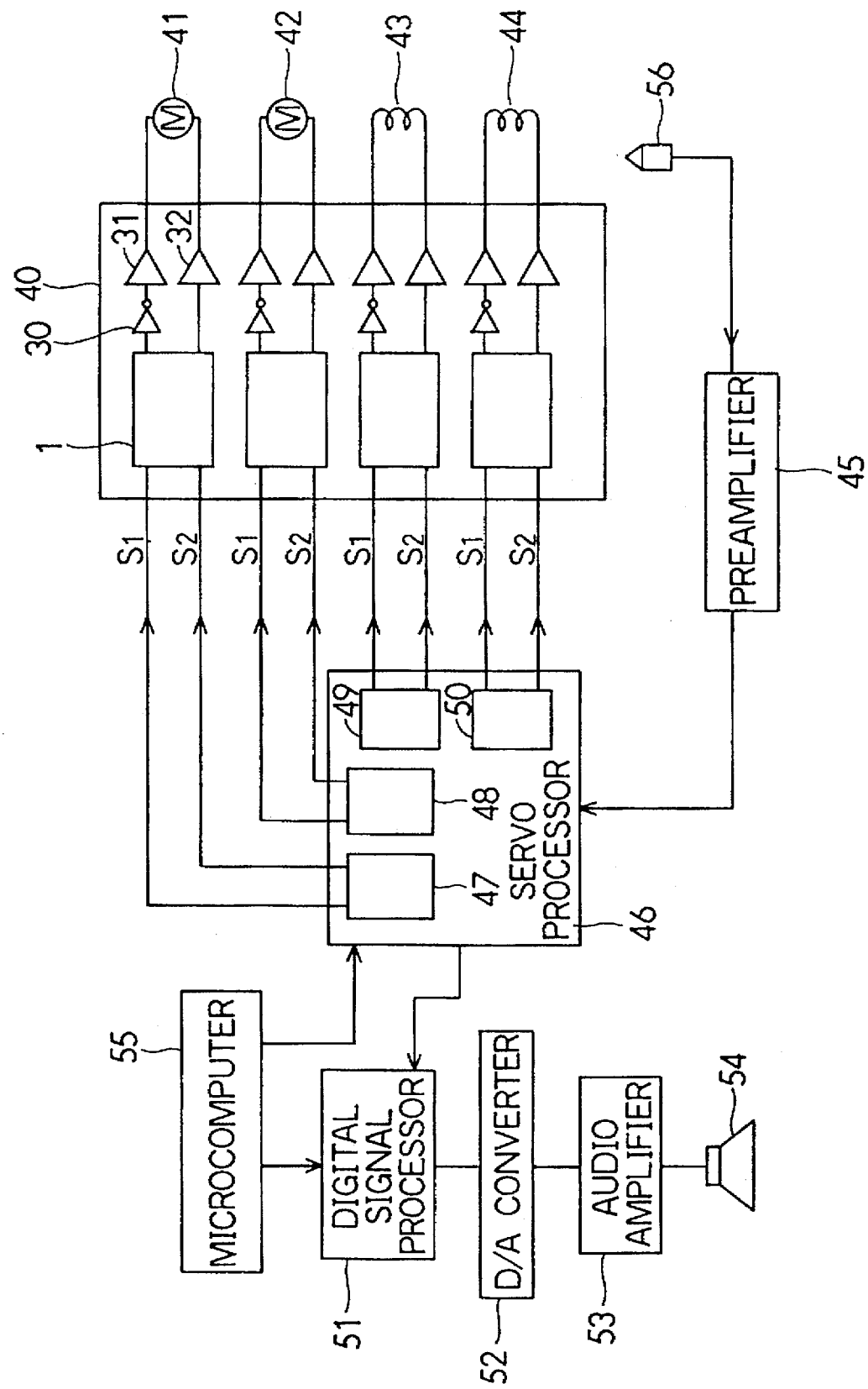
FIG. 9 is a circuit diagram showing an embodiment where the present invention is applied to a CD player.

Next, FIG. 9 shows how the circuit of the present invention is applied to a CD player. Reference numeral 40 represents a driver IC for driving loads such as motors, coils, or other. The driver IC 40 drives each of its loads according to the above-described BTL method. Reference numeral 41 represents a spindle motor, reference numeral 42 represents a feed motor for moving a pickup radially along a disc surface, reference numeral 43 represents a focus coil, and reference numeral 44 represents a tracking coil. In accordance with these loads 41 to 44, the IC 40 incorporates D/A conversion interfaces and drive buffer circuits as shown in FIG. 5 or FIG. 8.

Reference numeral 56 represents an optical pickup that reads signals from a disc and delivers them through the preamplifier 45 into a servo processor 46. The servo processor 46 includes a spindle control circuit 47, a feed motor control circuit 48, a focus error detection circuit 49, a tracking error detection circuit 50, and other circuits. These circuits each produce forward signal pulses $S_1$ and reverse signal pulses $S_2$, and supply them to the driver IC 40. Although the servo processor 46 is actually supplied with a signal from a motor rotation state detection means as well, the circuits and wiring for this purpose are omitted from the diagram.

Further, the servo processor 46 directs the data from the preamplifier 45 to a digital signal processor 51. The digital signal processor 51 decodes the received data to form audio signals. The audio signals are converted into analog signals by a D/A converter 52, and are then supplied to an audio amplifier 53. Reference numeral 54 represents a loudspeaker, and reference numeral 55 represents a microcomputer that controls the whole CD player.

As described above, according to the present invention, the output voltage of the D/A conversion interface is determined by the time constant of the smoothing circuit and the operation periods of the switches. Moreover, the operation periods of the switches depend only on the pulse widths of the digital servo signals supplied, that is, they are not affected by variation in crest value of the pulses. Thus, it is possible to eliminate output voltage variation due to variation in crest value of the pulses, and accordingly it is possible to achieve correct servo control.

Moreover, since the smoothing circuit can be incorporated into an integrated circuit device, it is possible to reduce both the number of circuit elements and the costs required for mounting elements onto a circuit board.

What is claimed is:

1. A D/A conversion interface for converting a digital servo signal into an analog signal for output, comprising:

a first switch for supplying a constant current to a smoothing circuit that outputs an analog signal, and a second switch for extracting the constant current from said smoothing circuit, wherein an operation period of one of said first and second switches being controlled with forward signal pulses of a digital servo signal, an operation period of the other switch being controlled with reverse signal pulses of the digital servo signal.

2. A D/A conversion interface comprising:

a first constant current source, a first switch, a second switch, and a second constant current source, which are connected in series in this order between a power source line and a ground, a smoothing circuit connected between a node of said first and second switches and a reference potential point, means for supplying a digital servo signal such that an operation period of one of said first and second switches is controlled with forward signal pulses of the digital servo signal and an operation period of the other switch is controlled with reverse signal pulses of the digital servo signal, and means for extracting an analog servo signal from said node.

3. A D/A conversion interface as claimed in claim 2, wherein, said extracting means includes a current-to-voltage converting amplifier for converting an output current from the smoothing circuit to a voltage.

4. A D/A conversion interface as claimed in claim 2, further comprising:

means for forming said analog servo signal into two signals having phases inverse to each other; and means for applying said two signals to both ends of a motor coil.

5. A D/A conversion interface having a plurality of D/A conversion means each comprising:

a first constant current source, a first switch, a second switch, and a second constant current source, which are connected in series in this order between a power source line and a ground, a smoothing circuit connected between a node of said first and second switches and a reference potential point, means for inputting a digital servo signal such that an operation period of one of said first and second switches is controlled with forward signal pulses of the digital servo signal and an operation period of the other switch is controlled with reverse signal pulses of the digital servo signal, and means for extracting an analog servo signal from said node.

6. A D/A conversion interface as claimed in claim 5, wherein the plurality of D/A conversion means are used to control a spindle motor of a disc player, to control a pickup feed motor, to control a focus coil, and to control a tracking coil.

* * * * *